US011596091B2

(12) United States Patent
Shimizu et al.

(10) Patent No.: US 11,596,091 B2
(45) Date of Patent: Feb. 28, 2023

(54) COMPONENT MOUNTER, COMPONENT MOUNTING LINE, AND MANUFACTURING METHOD OF MOUNTING BOARD

(71) Applicant: Panasonic Intellectual Property Management Co., Ltd., Osaka (JP)

(72) Inventors: Junkei Shimizu, Yamanashi (JP); Takeyuki Kawase, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1032 days.

(21) Appl. No.: 16/182,674

(22) Filed: Nov. 7, 2018

(65) Prior Publication Data

US 2019/0166736 A1 May 30, 2019

(30) Foreign Application Priority Data

Nov. 28, 2017 (JP) .............................. JP2017-227367

(51) Int. Cl.
*H05K 13/08* (2006.01)
*H05K 13/00* (2006.01)

(52) U.S. Cl.
CPC ..... *H05K 13/0882* (2018.08); *H05K 13/0061* (2013.01); *H05K 13/086* (2018.08); *H05K 13/0853* (2018.08)

(58) Field of Classification Search
CPC .......... H05K 13/0882; H05K 13/0853; H05K 13/0061; H05K 13/086
See application file for complete search history.

(56) References Cited

U.S. PATENT DOCUMENTS 8,510,937 B2 * 8/2013 Kawase ............. H05K 13/0061
29/832
2016/0029493 A1 1/2016 Sumi

FOREIGN PATENT DOCUMENTS

JP 2016-025270 A 2/2016

* cited by examiner

*Primary Examiner* — Livius R. Cazan
(74) *Attorney, Agent, or Firm* — Pearne & Gordon LLP

(57) ABSTRACT

There is provided a component mounter including: a plurality of transport lanes for transporting a board sorted by a board sorting device; a congestion index calculator for calculating a congestion index indicating a congestion degree of each of the plurality of transport lanes; a transport lane determiner for determining a transport lane for carrying in the board among the plurality of transport lanes based on the calculated congestion index; and an outputter for outputting a board request signal for requesting to carry the board into the transport lane determined by the transport lane determiner, to the board sorting device.

19 Claims, 10 Drawing Sheets

|  | EVALUATION VALUE | | |
|---|---|---|---|
|  | CARRY-IN AREA | MOUNTING AREA | CARRY-OUT AREA |
| FRONT SIDE TRANSPORT LANE 8F | 3 | 2 | 1 |
| REAR SIDE TRANSPORT LANE 8R | 3 | 2 | 1 |

| | | COMPONENT MOUNTER M3 | | | COMPONENT MOUNTER M4 | | |
|---|---|---|---|---|---|---|---|
| | | CARRY-IN AREA | MOUNTING AREA | CARRY-OUT AREA | CARRY-IN AREA | MOUNTING AREA | CARRY-OUT AREA |
| | WEIGHT | | 3 | | | 1 | |
| CONNECTED FRONT SIDE TRANSPORT LANE 8F | EVALUATION VALUE | 3 | 2 | 1 | 3 | 2 | 1 |
| | BOARD PRESENCE AND ABSENCE INFORMATION | ABSENT | PRESENT | ABSENT | ABSENT | PRESENT | ABSENT |
| | CONGESTION INDEX | | 2 | | | 2 | |
| | CONNECTING CONGESTION INDEX | | | 8 | | | |
| CONNECTED REAR SIDE TRANSPORT LANE 8R | EVALUATION VALUE | 3 | 2 | 1 | 3 | 2 | 1 |
| | BOARD PRESENCE AND ABSENCE INFORMATION | ABSENT | PRESENT | ABSENT | PRESENT | ABSENT | ABSENT |
| | CONGESTION INDEX | | 2 | | | 3 | |
| | CONNECTING CONGESTION INDEX | | | 9 | | | |

| | | COMPONENT MOUNTER M3 | | | COMPONENT MOUNTER M4 | | |
|---|---|---|---|---|---|---|---|
| | | CARRY-IN AREA | MOUNTING AREA | CARRY-OUT AREA | CARRY-IN AREA | MOUNTING AREA | CARRY-OUT AREA |
| CONNECTED FRONT SIDE TRANSPORT LANE 8F | EVALUATION VALUE | 6 | 5 | 4 | 3 | 2 | 1 |
| | BOARD PRESENCE AND ABSENCE INFORMATION | ABSENT | PRESENT | ABSENT | ABSENT | PRESENT | ABSENT |
| | CONNECTING CONGESTION INDEX | | | 7 | | | |
| CONNECTED REAR SIDE TRANSPORT LANE 8R | EVALUATION VALUE | 6 | 5 | 4 | 3 | 2 | 1 |
| | BOARD PRESENCE AND ABSENCE INFORMATION | ABSENT | PRESENT | ABSENT | PRESENT | ABSENT | ABSENT |
| | CONNECTING CONGESTION INDEX | | | 8 | | | |

FIG. 10

COMPONENT MOUNTER, COMPONENT MOUNTING LINE, AND MANUFACTURING METHOD OF MOUNTING BOARD

BACKGROUND

1. Technical Field

The present disclosure relates to a component mounter for mounting a component on a board sorted into a plurality of transport lanes, a component mounting line, and a manufacturing method of a mounting board.

2. Description of the Related Art

A component mounter which has two transport lanes and can mount a component by transporting a board on each of the transport lanes, is known (for example, Japanese Patent Unexamined Publication No. 2016-25270). The component mounter described in Japanese Patent Unexamined Publication No. 2016-25270 has a carry-in area for carrying the board into a transport lane and a mounting area for mounting the component on the board received from the carry-in area, respectively. On an upstream side of a component mounter, a board sorting device for sorting the board is connected to any of the two transport lanes, and by determining the transport lane for sorting the board based on the presence and absence of the board in the carry-in area and in the mounting area, productivity is improved by reducing a waiting time in the component mounter.

SUMMARY

According to an aspect of the disclosure, there is provided a component mounter including: a plurality of transport lanes for transporting a board sorted by a board sorting device; a congestion index calculator for calculating a congestion index indicating a congestion degree of each of the plurality of transport lanes; a transport lane determiner for determining a transport lane for carrying in the board among the plurality of transport lanes based on the calculated congestion index; and an outputter for outputting a board request signal for requesting to carry the board into the transport lane determined by the transport lane determiner, to the board sorting device.

According to another aspect of the disclosure, there is provided a component mounting line including: a plurality of component mounters each including a plurality of connecting transport lanes having a plurality of transport lanes for transporting a board; a connecting congestion index calculator for calculating a connecting congestion index indicating a congestion degree of each of the plurality of connecting transport lanes; a connecting transport lane determiner for determining a connecting transport lane for carrying in the board among the plurality of connecting transport lanes based on the calculated connecting congestion index; and a board sorting device for sorting the board into the connecting transport lane determined by the connecting transport lane determiner.

According to still another aspect of the disclosure, there is provided a manufacturing method of a mounting board in a component mounting line including a plurality of component mounters each including a plurality of connecting transport lanes having a plurality of transport lanes for transporting a board, and a board sorting device for sorting the board, the method including: a connecting congestion index calculating step of calculating a connecting congestion index indicating a congestion degree of each of the plurality of connecting transport lanes; a connecting transport lane determining step of determining a connecting transport lane for carrying in the board among the plurality of connecting transport lanes based on the calculated connecting congestion index; and a board sorting step of sorting the board by the board sorting device into the connecting transport lane determined in the connecting transport lane determining step.

According to the disclosure, it is possible to improve productivity by carrying a board into an appropriate transport lane.

DETAILED DESCRIPTION

In the component mounter described in Japanese Patent Unexamined Publication No. 2016-25270, when determining a transport lane for sorting the board, the congestion degree of the transport lane including the device connected to the downstream side of the component mounter is not taken into account, and there was room for further improvement for improving productivity.

Here, an object of the disclosure is to provide a component mounter, a component mounting line, and a manufacturing method of a mounting board that can carry a board into an appropriate transport lane and improve productivity.

Figure 1:
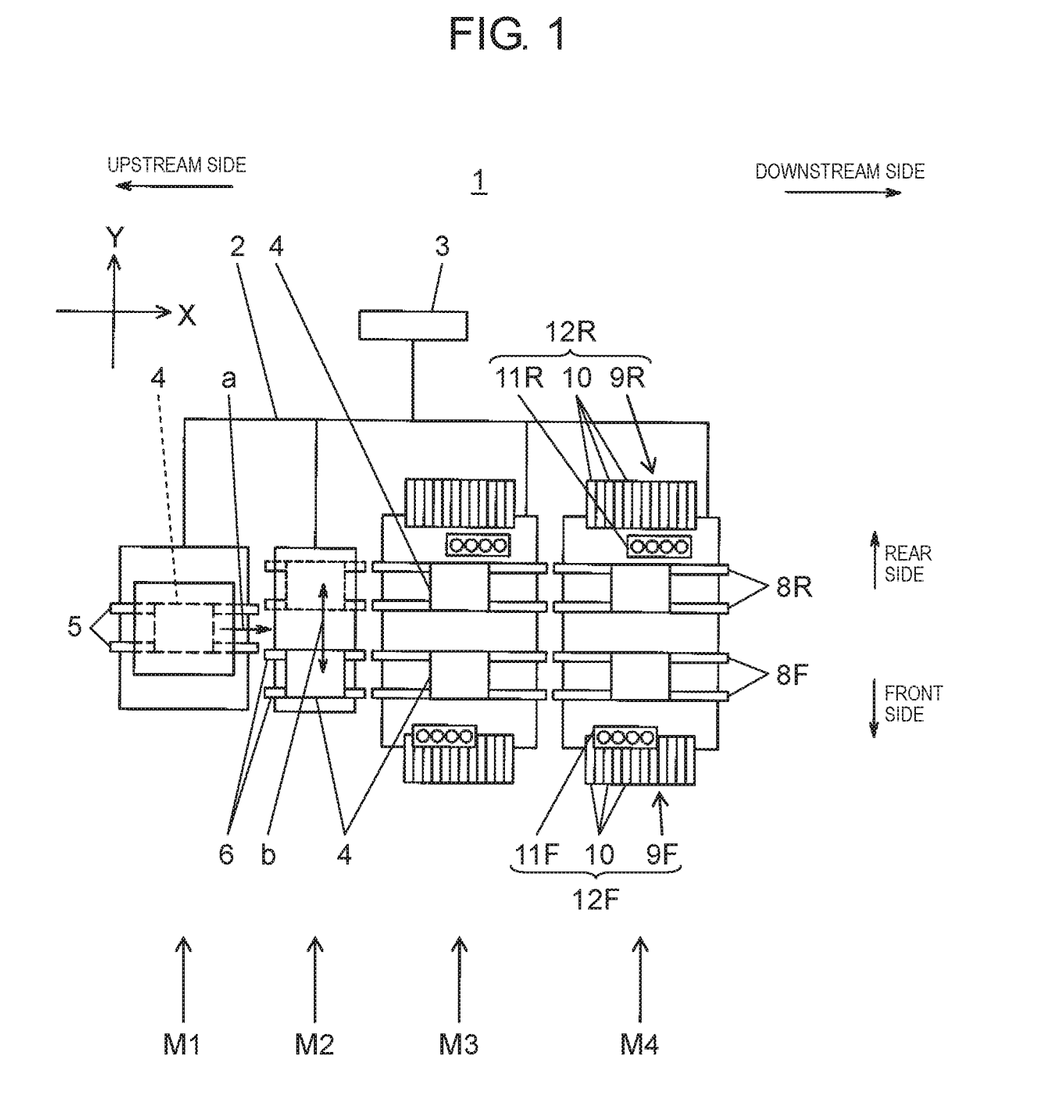
FIG. 1 is a configuration explanatory view of a component mounting line according to an embodiment of the disclosure.

An embodiment of the disclosure will be described in detail below with reference to the drawings. The configurations, shapes and the like described below are examples for the description, and can be appropriately changed in accordance with the specifications of the component mounting line, the board sorting device, and the component mounter. Hereinafter, the same reference numerals will be given to the corresponding elements in all of the drawings, and redundant description thereof will be omitted. In FIG. 1 and at a part which will be described later, as two axial directions orthogonal to each other in a horizontal plane, an X direction (left-right direction in FIG. 1) in a board transport direction and a Y direction (up-down direction in FIG. 1) orthogonal to the board transport direction will be illustrated. In FIG. 1 and at a part which will be described later, a left side of the page is referred to as an upstream side in the board transport direction, a right side of the page is referred to as a downstream side in the board transport direction, a lower side of the page is referred to as a front side, and an upper side of the page is referred to as a rear side.

First, with reference to FIG. 1, a configuration of component mounting line 1 will be described. Component mounting line 1 has a configuration in which printing device M1 disposed from the upstream side to the downstream side, board sorting device M2, component mounter M3, and component mounter M4 are connected to each other via communication network 2 and all of the members are controlled by management computer 3. In addition, the number of component mounters M3 and M4 included in component mounting line 1 are not limited to two, and may be one, three, or more.

Printing device M1 has a function of printing a solder paste for component bonding on an electrode of board 4 by a printing mechanism (not illustrated). Printing device M1 includes a pair of transport conveyors 5 that extend in the X direction. Transport conveyor 5 transports and positions board 4 to a predetermined printing position, and carries out board 4 printed with the solder paste to board sorting device M2 (arrow a).

Board sorting device M2 is provided with a pair of transport conveyors 6 that extend in the X direction. Transport conveyor 6 is freely movable in the Y direction by conveyor moving mechanism 7 (FIG. 3) (arrow b). Board sorting device M2 sorts board 4 carried out from printing device M1 to either front side transport lane 8F or rear side transport lane 8R which are provided in component mounter M3 which will be described later in response to a request.

In FIG. 1, component mounters M3 and M4 have a function of mounting a component on board 4 sorted by board sorting device M2. In component mounters M3 and M4, front side transport lane 8F and rear side transport lane 8R that extend in the X direction are provided in a state of being in parallel in the Y direction. For the sake of convenience, except for a case where front side transport lane 8F and rear side transport lane 8R are not distinguished in the description, the transport lanes will be referred to as "transport lanes 8F and 8R". Transport lanes 8F and 8R have a function of transporting board 4 sorted by board sorting device M2 and positioning board 4 at a predetermined mounting work position (position of board 4 indicated by a solid line). A plurality of transport lanes 8F and 8R are connected to each other between the plurality of component mounters M3 and M4.

On the front side of front side transport lane 8F and on the rear side of rear side transport lane 8R, component suppliers 9F and 9R are respectively disposed. In component suppliers 9F and 9R, a plurality of tape feeders 10 disposed in the X direction are set. Tape feeder 10 pitch-feeds the component held on a carrier tape and supplies the component to a pickup position by mounting heads 11F and 11R.

Mounting heads 11F and 11R respectively move in a horizontal direction (X direction and Y direction) by a head moving mechanism (not illustrated). Mounting heads 11F and 11R respectively pick up the components supplied from component suppliers 9F and 9R by suction nozzles and mount the components on board 4 positioned at the mounting position of transport lanes 8F and 8R.

In FIG. 1, in component mounters M3 and M4, front side component supplier 9F, tape feeder 10 set in front side component supplier 9F, front side mounting head 11F, and a front side head moving mechanism configure front side component mounting mechanism 12F. In addition, in component mounters M3 and M4, rear side component supplier 9R, tape feeder 10 set in rear side component supplier 9R, rear side mounting head 11R, and a rear side head moving mechanism configure rear side component mounting mechanism 12R.

As described above, component mounting line 1 includes a plurality of component mounters M3 and M4 including a plurality of transport lanes 8F and 8R for transporting board 4, and board sorting device M2 for sorting board 4 into any of the plurality of transport lanes 8F and 8R included in the component mounters M3 on the most upstream side among the plurality of component mounters M3 and M4.

Next, the details of transport lanes 8F and 8R will be described with reference to FIG. 2. Transport lanes 8F and 8R are provided with a pair of transport rails 13 that extend in the X direction. On the inner side of transport rail 13, a plurality (three in this case) of divided conveyor mechanisms are disposed. The conveyor mechanism is configured to include a pair of carry-in conveyors 14, mounting conveyors 15, and carry-out conveyors 16 disposed sequentially in order from the upstream side.

Carry-in conveyor 14 delivers board 4 received from the device on the upstream side to mounting conveyor 15. Mounting conveyor 15 transports and positions board 4 received from carry-in conveyor 14 to the mounting work position, and delivers board 4 on which the component is mounted, to carry-out conveyor 16. Carry-out conveyor 16 carries out board 4 received from mounting conveyor 15 to the device on the downstream side.

The conveyor mechanisms individually have power sources and can independently transport board 4. Therefore, even in a case where the component mounting work for board 4 held on mounting conveyor 15 has not been completed, carry-in conveyor 14 can receive board 4 from the device on the upstream side and stand by.

Figure 2:
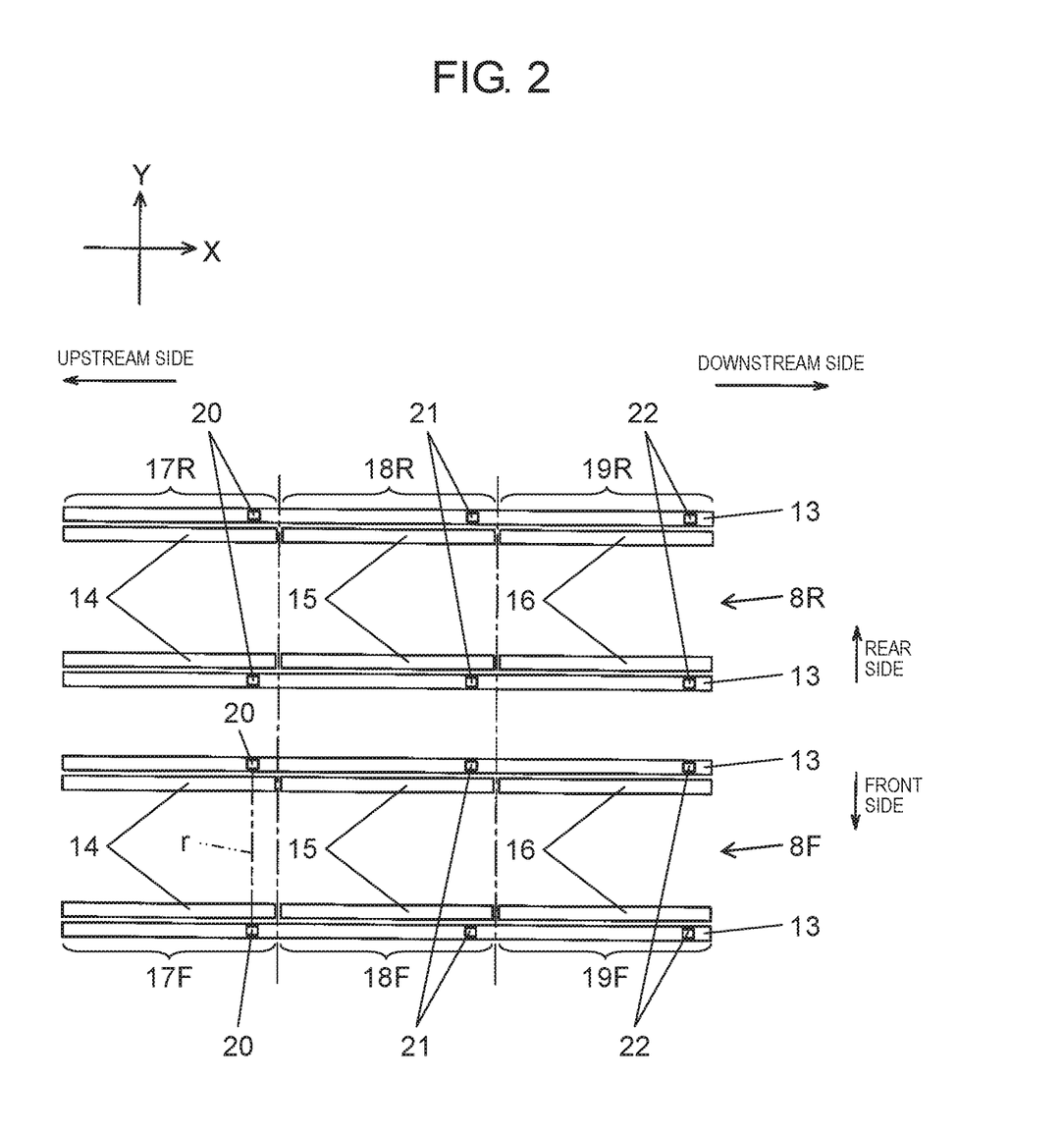
FIG. 2 is a plan view of a transport lane included in a component mounter that configures the component mounting line according to the embodiment of the disclosure.

In FIG. 2, in transport lanes 8F and 8R, a region where carry-in conveyor 14 is disposed is carry-in areas 17F and 17R for carrying in board 4 received from the device on the upstream side. In addition, the region where mounting conveyor 15 is disposed is mounting areas 18F and 18R for mounting the component on board 4 received from carry-in areas 17F and 17R. Furthermore, the region where carry-out conveyor 16 is disposed is carry-out areas 19F and 19R for carrying out board 4 on which the component is mounted to the device on the downstream side.

In this manner, each of the plurality of transport lanes 8F and 8R provided in each of the plurality of component mounters M3 and M4 includes carry-in areas 17F and 17R for carrying in board 4 from the upstream side, mounting areas 18F and 18R for receiving board 4 from carry-in areas 17F and 17R and mounting the components, and carry-out areas 19F and 19R for receiving board 4 on which the component is mounted in the mounting areas 18F and 18R and carrying out board 4 to the downstream side.

Carry-in areas 17F and 17R of the plurality of transport lanes 8F and 8R provided in component mounter M3 on the most upstream side among the plurality of connected component mounters M3 and M4 carry in board 4 sorted by board sorting device M2 (device on the upstream side) on the upstream side.

Carry-in areas 17F and 17R of the plurality of transport lanes 8F and 8R provided in component mounter M4 on the downstream side carry in board 4 carried out by component mounter M3 (device on the upstream side) on the upstream side.

In FIG. 2, in a pair of transport rails 13, a pair of board detection sensors 20 are provided facing each other at positions that correspond to the downstream ends of carry-in areas 17F and 17R. Similarly, a pair of board detection sensors 21 are provided facing each other at positions that correspond to the downstream ends of mounting areas 18F and 18R. Furthermore, a pair of board detection sensors 22 are provided facing each other at positions that correspond to the downstream ends of carry-out areas 19F and 19R.

Board detection sensors 20, 21, and 22 are optical sensors combining a light projector and a light receiver. The light projector projects inspection light r in the Y direction toward the light receiver. Board detection sensors 20, 21, and 22 detect the presence and absence of board 4 in each area depending on whether or not board 4 shields inspection light r. When board detection sensors 20, 21, and 22 detect board 4, carry-in conveyor 14, mounting conveyor 15, and carry-out conveyor 16 respectively stop driving and position board 4 in each area.

Next, with reference to FIG. 3, the configuration of a control system of component mounting line 1 will be described focusing on component mounters M3 and M4. Board sorting device M2 is provided with sorting controller 31, transport conveyor 6, and conveyor moving mechanism 7. Sorting controller 31 includes sorting storage 32, sorting operation processor 34, and sorting communicator 35. Sorting communicator 35 is a communication interface and receives signals and data with management computer 3, printing device M1, component mounters M3 and M4 via communication network 2.

Sorting storage 32 is a storage device and includes transport lane storage 33. In transport lane storage 33, information of transport lanes 8F and 8R which are included in a board movement signal and a board request signal transmitted from component mounter M3 on the most upstream side or from management computer 3 and request carry-in of board 4, is stored. Sorting operation processor 34 executes a board sorting work by controlling transport conveyor 6 and conveyor moving mechanism 7 based on the information of transport lanes 8F and 8R which request carry-in of board 4 stored in transport lane storage 33.

Figure 5A:
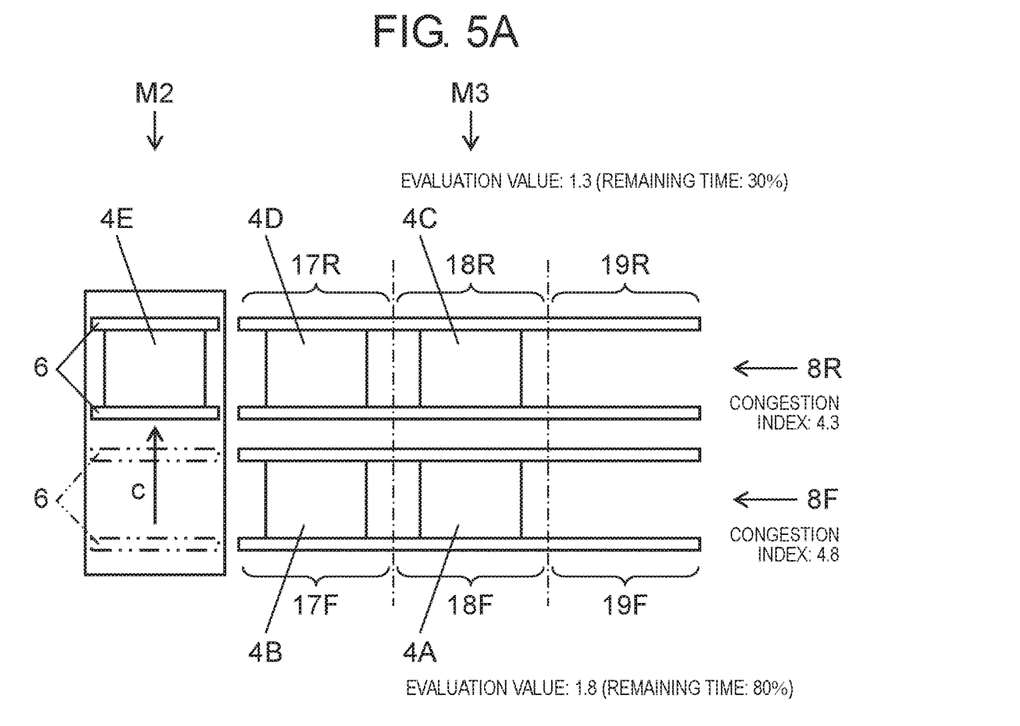
FIG. 5A is an explanatory view of sorting of a board into a carry-in area in the component mounting line according to the embodiment of the disclosure.

Specifically, sorting operation processor 34 receives board 4 carried out by printing device M1, holds board 4 in transport conveyor 6, and moves transport conveyor 6 such that board 4 can be carried out to transport lanes 8F and 8R that request the carry-in (refer to FIG. 5A). In sorting operation processor 34, board sorting device M2 receives information (board request signal) indicating that board 4 has disappeared in carry-in areas 17F and 17R of component mounter M3 on the most upstream side in transport lanes 8F and 8F which requests the carry-in, board 4 held by transport conveyor 6 is carried out to transport lanes 8F and 8R (refer to FIG. 5B).

Figure 3:
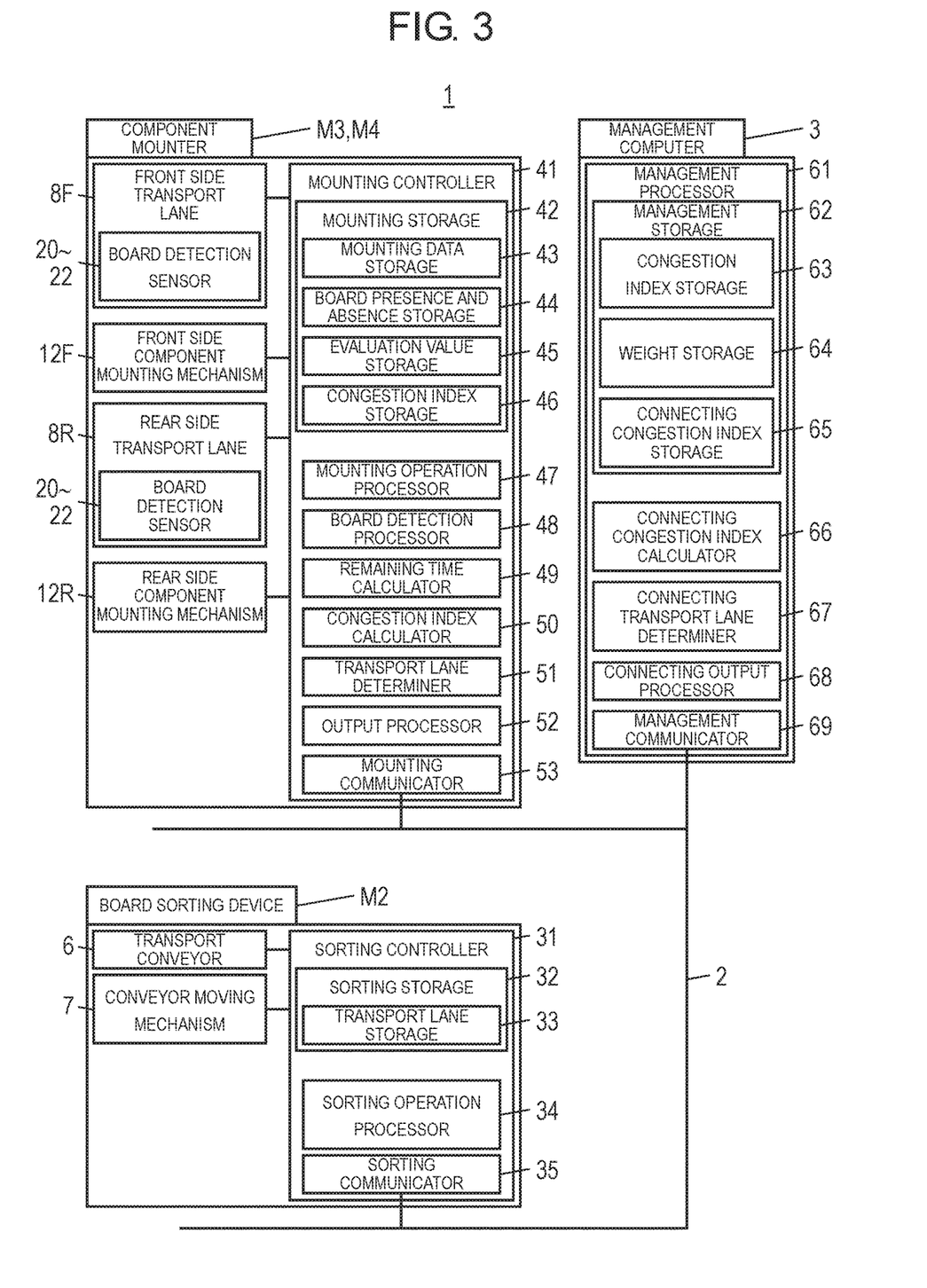
FIG. 3 is a block diagram illustrating a configuration of a control system of the component mounting line according to the embodiment of the disclosure.

In FIG. 3, component mounters M3 and M4 are provided with mounting controller 41, front side transport lane 8F, front side component mounting mechanism 12F, rear side transport lane 8R, and rear side component mounting mechanism 12R. Mounting controller 41 includes mounting storage 42, mounting operation processor 47, board detection processor 48, remaining time calculator 49, congestion index calculator 50, transport lane determiner 51, output processor 52, and mounting communicator 53. Mounting communicator 53 is a communication interface and receives signals and data with management computer 3, printing device M1, board sorting device M2, and other component mounters M3 and M4 via communication network 2. Mounting controller 41 has, for example, a processor. All or a part of the functions of mounting controller 41 is realized, for example, as the processor executes a program stored in a memory (for example, mounting storage 42).

Mounting storage 42 is a storage device and includes mounting data storage 43, board presence and absence storage 44, evaluation value storage 45, and congestion index storage 46. In mounting data storage 43, mounting data including types and shapes (sizes and the like) of components mounted on board 4, coordinates of mounting positions, and the like, is stored for each type of the mounting board. Mounting operation processor 47 controls front side transport lane 8F, front side component mounting mechanism 12F, rear side transport lane 8R, and rear side component mounting mechanism 12R based on the mounting data stored in mounting data storage 43, and executes a component mounting operation for mounting a component on board 4.

Specifically, mounting operation processor 47 controls front side transport lane 8F and rear side transport lane 8R and transports board 4 independently in carry-in areas 17F and 17R, mounting areas 18F and 18R, and carry-out areas 19F and 19R. Mounting operation processor 47 controls front side component mounting mechanism 12F and rear side component mounting mechanism 12R, and individually mounts the components on boards 4 positioned respectively at the mounting work position of front side transport lane 8F and rear side transport lane 8R.

In FIG. 3, board detection processor 48 sequentially receives the detection result of board 4 by board detection sensors 20, 21, and 22 included respectively in front side transport lane 8F and rear side transport lane 8R, and detects the presence and absence of board 4 in carry-in areas 17F and 17R, mounting areas 18F and 18R, and carry-out areas 19F and 19R. Board detection processor 48 stores the presence and absence information of detected board 4 in board presence and absence storage 44 and transmits the presence and absence information to management computer 3 via mounting communicator 53.

Remaining time calculator 49 calculates a remaining time until completion of the component mounting work for board 4 positioned at the mounting work position of mounting areas 18F and 18R. Any method may be used for the calculation. For example, remaining time calculator 49 may count the time from the timing when board detection sensor 21 detects board 4, and calculate the remaining time by subtracting the counted time from the previously calculated mounting time per one board. Further, remaining time calculator 49 may calculate the remaining time based on a progress status of the component mounting work. In addition, remaining time calculator 49 may calculate a progress ratio of the mounting work. Remaining time calculator 49 causes the calculated remaining time to be transmitted to management computer 3 via mounting communicator 53.

Figure 4:
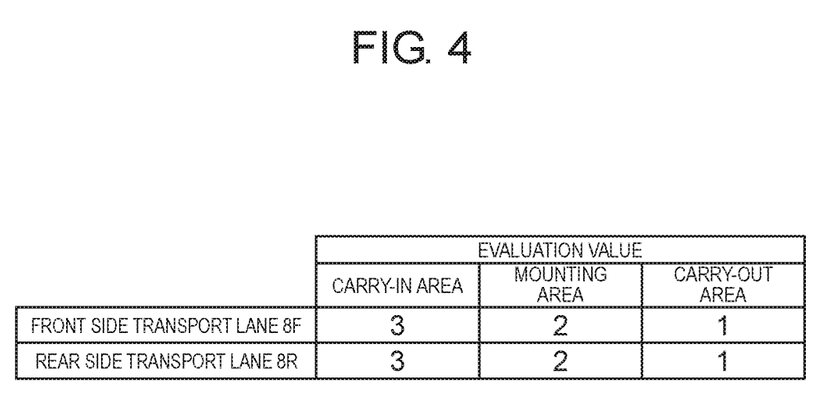
FIG. 4 is an explanatory view of an example of evaluation values used in the component mounter that configures the component mounting line according to the embodiment of the disclosure.

In evaluation value storage 45, an evaluation value that becomes a basis for calculating the congestion index which will be described later is stored. Here, with reference to FIG.

4, examples of the evaluation values in component mounters M3 and M4 will be described. The evaluation values are set for each of carry-in areas 17F and 17R, mounting areas 18F and 18R, and carry-out areas 19F and 19R. The same evaluation value is set for front side transport lane 8F and rear side transport lane 8R. Specifically, the evaluation value (first evaluation value) of carry-in areas 17F and 17R is "3", the evaluation value (second evaluation value) of mounting areas 18F and 18R is "2", and the evaluation value (third evaluation value) of carry-out areas 19F and 19R is set to "1".

In the example of FIG. 4, the evaluation values are set to be greater in order of each of carry-in areas 17F and 17R, mounting areas 18F and 18R, and carry-out areas 19F and 19R. Hereinafter, the setting is referred to as a first definition. In addition, the evaluation value may be set with a second definition to be smaller in order of carry-in areas 17F and 17R, mounting areas 18F and 18R, and carry-out areas 19F and 19R.

In FIG. 3, congestion index calculator 50 calculates the congestion index indicating a congestion degree of each of the plurality of transport lanes 8F and 8R based on the presence and absence information of board 4 in carry-in areas 17F and 17R, mounting areas 18F and 18R, and carry-out areas 19F and 19R stored in board presence and absence storage 44 and the evaluation value stored in evaluation value storage 45. Specifically, congestion index calculator 50 calculates the congestion index by adding up the evaluation values of carry-in areas 17F and 17R, mounting areas 18F and 18R, and carry-out areas 19F and 19R where board 4 exists. In other words, congestion index calculator 50 calculates the congestion index of transport lanes 8F and 8R based on the evaluation values of carry-in areas 17F and 17R, the evaluation values of mounting areas 18F and 18R, the evaluation values of carry-out areas 19F and 19R, and the presence and absence information of board 4.

Congestion index calculator 50 recalculates the evaluation values of mounting areas 18F and 18R based on the remaining time calculated by remaining time calculator 49 in a case where there is board 4 under mounting work. Specifically, congestion index calculator 50 calculates the evaluation values of mounting areas 18F and 18R in proportion to the remaining time so as to be values between the evaluation values of the mounting areas 18F and 18R and the evaluation values of carry-out areas 19F and 19R which are stored in evaluation value storage 45 (refer to FIG. 5A).

In other words, in a case where there is board 4 in mounting areas 18F and 18R, when the remaining time during which the component is mounted on board 4 is long, congestion index calculator 50 sets (recalculates) the evaluation value so as to be greater in a case of setting with the first definition, and to be smaller in a case of setting with the second definition. In other words, congestion index calculator 50 calculates the congestion index based on the remaining time during which the component is mounted on board 4. Congestion index calculator 50 stores the calculated congestion index in congestion index storage 46 and transmits the congestion index to management computer 3 via mounting communicator 53.

In FIG. 3, transport lane determiner 51 determines into which of the plurality of transport lanes 8F and 8R board 4 is carried in, based on the congestion index stored in congestion index storage 46. Specifically, in a case where the evaluation value is set with the first definition, transport lane determiner 51 determines to carry board 4 into transport lanes 8F and 8R in which the congestion index becomes the smallest among the plurality of transport lanes 8F and 8R. In addition, in a case where the evaluation value is set with the second definition, transport lane determiner 51 determines to carry board 4 into transport lanes 8F and 8R in which the congestion index becomes the largest among the plurality of transport lanes 8F and 8R.

Output processor 52 outputs the board movement signal for requesting to move transport conveyor 6 that holds board 4, to board sorting device M2 via mounting communicator 53 so as to be capable of directly carrying out board 4 to transport lanes 8F and 8R determined by transport lane determiner 51. Further, output processor 52 outputs the board request signal for requesting carry-in of board 4, to board sorting device M2 via mounting communicator 53 in a case where there is no board 4 in carry-in areas 17F and 17R of transport lanes 8F and 8R determined by transport lane determiner 51. In other words, output processor 52 and mounting communicator 53 are outputters for outputting the board request signal for requesting carry-in of board 4 into transport lanes 8F and 8R determined by transport lane determiner 51, to board sorting device M2.

Here, with reference to FIGS. 5A and 5B, in component mounting line 1 configured with board sorting device M2 and component mounter M3, a step in which board 4 is sorted based on the evaluation value of the first definition illustrated in FIG. 4 will be described. In FIG. 5A, in component mounter M3, board 4A is held at the mounting work position of mounting area 18F of front side transport lane 8F. Congestion index calculator 50 calculates the evaluation value as "1.8" based on a ratio (80%) of the remaining time of the mounting work. In carry-in area 17F of front side transport lane 8F, board 4B is held. Congestion index calculator 50 adds up the evaluation value "3" of carry-in area 17F and the evaluation value "1.8" of mounting area 18F and calculates the congestion index of front side transport lane 8F to be "4.8".

In FIG. 5A, board 4C is held at the mounting work position of mounting area 18R of rear side transport lane 8R. Congestion index calculator 50 calculates the evaluation value as "1.3" based on a ratio (30%) of the remaining time of the mounting work. In carry-in area 17R of rear side transport lane 8R, board 4D is held. Congestion index calculator 50 adds up the evaluation value "3" of carry-in area 17R and the evaluation value "1.3" of mounting area 18R and calculates the congestion index of rear side transport lane 8R as "4.3".

Transport lane determiner 51 determines to carry board 4E into rear side transport lane 8R where the congestion index is small, and output processor 52 outputs the board movement signal to board sorting device M2. Board sorting device M2 that has received the board movement signal moves board 4E held by transport conveyor 6 to a position where it is possible to carry out board 4E to rear side transport lane 8R (arrow c). Carry-in area 17R of rear side transport lane 8R has board 4D, and board sorting device M2 stands by in this state.

Figure 5B:
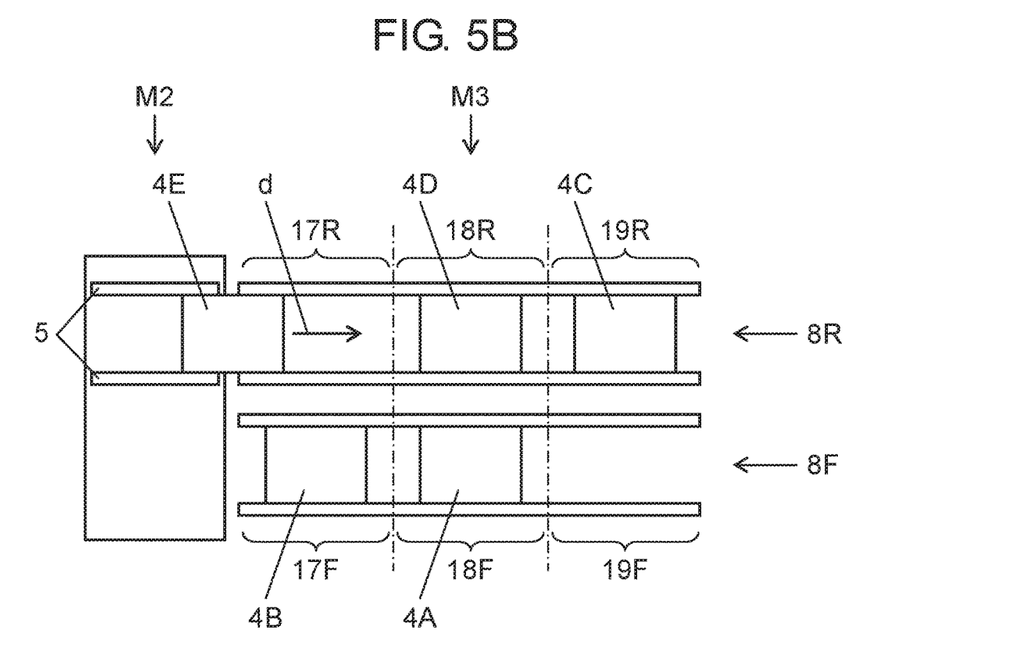
FIG. 5B is an explanatory view of sorting of the board into the carry-in area in the component mounting line according to the embodiment of the disclosure.

In FIG. 5B, in rear side transport lane 8R, when board 4C on which the mounting work has been completed is transported to carry-out area 19R, board 4D is transported to empty mounting area 18R, and there is no board in carry-in area 17R on the most upstream side, output processor 52 outputs the board request signal to board sorting device M2. Board sorting device M2 which has received the board request signal carries out board 4E to rear side transport lane 8R (arrow d).

In this manner, board sorting device M2 moves board 4E such that board 4E can be carried out to rear side transport lane 8R determined by transport lane determiner 51, and board 4E is carried out when the board has disappeared in carry-in area 17R on the most upstream side of rear side transport lane 8R. According to this, it is possible to improve productivity by carrying board 4 into appropriate transport lanes 8F and 8R.

In FIG. 3, management computer 3 includes management processor 61. Management processor 61 includes management storage 62, connecting congestion index calculator 66, connecting transport lane determiner 67, connecting output processor 68, and management communicator 69. Management communicator 69 is a communication interface and receives signals and data with printing device M1, board sorting device M2, component mounters M3 and M4 via communication network 2. Management storage 62 is a storage device and includes congestion index storage 63, weight storage 64, and connecting congestion index storage 65.

In congestion index storage 63, congestion indices transmitted from component mounters M3 and M4 are stored in association with component mounters M3 and M4. Weight storage 64 stores the weights used in calculation of a connecting congestion index which will be described later. The weight is set for each of the component mounters M3 and M4 (refer to FIG. 6).

In FIG. 3, connecting congestion index calculator 66 calculates the connecting congestion index indicating the congestion degree of each of the plurality of transport lanes 8F and 8R connected to each other between the plurality of component mounters M3 and M4. Specifically, connecting congestion index calculator 66 adds up a value obtained by respectively multiplying the weights of each of component mounters M3 and M4 stored in weight storage 64 by the congestion index of front side transport lane 8F of each of component mounters M3 and M4 stored in congestion index storage 63, and calculates the connecting congestion index of connected front side transport lane 8F. Similarly, connecting congestion index calculator 66 also calculates the connecting congestion index of connected rear side transport lane 8R.

In addition, in FIG. 1, a transport lane in which transport lane 8F of component mounter M3 and transport lane 8F of component mounter M4 are connected to each other is also represented as a front side connecting transport lane. In other words, component mounters M3 and M4 are provided with the front side connecting transport lane and a rear side connecting transport lane. Each of the two connecting transport lanes has a transport lane of component mounter M3 and a transport lane of component mounter M4. Specifically, the front side connecting transport lane has transport lane 8F of component mounter M3 and transport lane 8F of component mounter M4. In other words, a plurality of component mounters have a plurality of connecting transport lanes. Each of the plurality of connecting transport lanes has a plurality of transport lanes for transporting the boards.

In other words, connecting congestion index calculator 66 calculates the connecting congestion indices based on the congestion index based on the presence and absence information of board 4 in each of carry-in areas 17F and 17R, mounting areas 18F and 18R, and carry-out areas 19F and 19R of each of the plurality of component mounters M3 and M4, which are calculated in the plurality of component mounters M3 and M4. Connecting congestion index calculator 66 stores the calculated connecting congestion index in connecting congestion index storage 65.

Here, with reference to FIG. 6, the calculation of the connecting congestion index of front side transport lane 8F and rear side transport lane 8R connected to each other between component mounter M3 and component mounter M4 will be described. The evaluation values of component mounter M3 and component mounter M4 are the same as the evaluation values illustrated in FIG. 4 set with the first definition. Here, for the sake of simplicity, the ratio of the remaining time of the mounting work of board 4 being mounted in mounting areas 18F and 18R is 100%.

Figure 6:
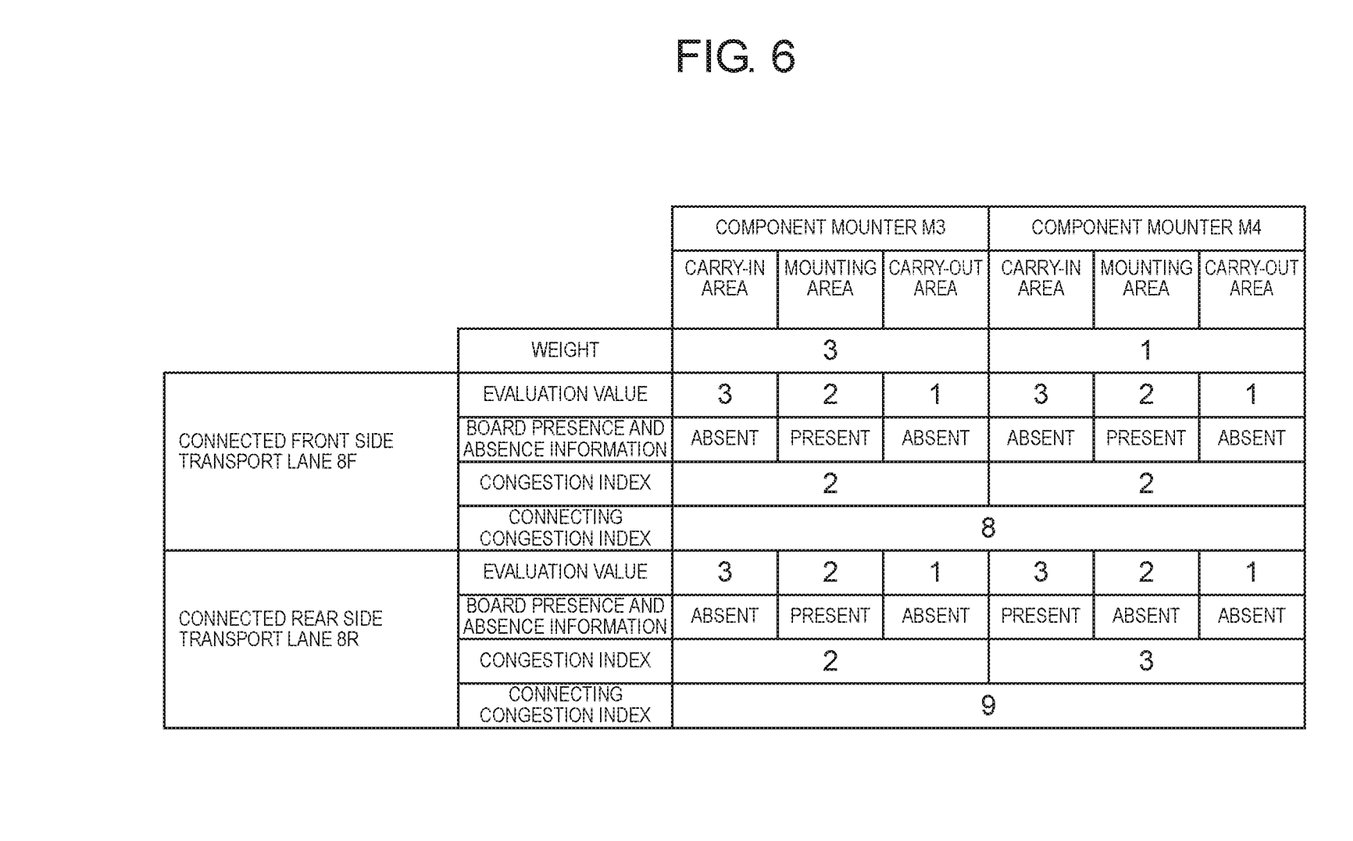
FIG. 6 is an explanatory view of calculation of a connecting congestion index in the component mounting line according to the embodiment of the disclosure.

In FIG. 6, the weight (first weight) of component mounter M3 on the upstream side is set to "3", and the weight (second weight) of component mounter M4 on the downstream side is set to "1". In connected front side transport lane 8F, there is board 4 in mounting area 18F of component mounter M3 and mounting area 18F of component mounter M4. From the evaluation value, the congestion index of component mounter M3 is calculated as "2", and the congestion index of component mounter M4 is calculated as "2". Connecting congestion index calculator 66 adds up the congestion index and the weight by multiplication and calculates the connecting congestion index of connected front side transport lane 8F as "8".

In FIG. 6, in connected rear side transport lane 8R, there is board 4 in mounting area 18R of component mounter M3 and carry-in area 17R of component mounter M4. From the evaluation value, the congestion index of component mounter M3 is calculated as "2", and the congestion index of component mounter M4 is calculated as "3". Connecting congestion index calculator 66 adds up the congestion index and the weight by multiplication and calculates the connecting congestion index of connected rear side transport lane 8R as "9".

In this manner, in a case where the evaluation value is the first definition, the connecting congestion index is a sum of the evaluation values set to be greater in the order that board 4 exists in carry-in areas 17F and 17R, mounting areas 18F and 18R, and carry-out areas 19F and 19R, and the evaluation value is weighted so as to be greater in component mounter M3 on the upstream side than that in component mounter M4 on the downstream side. In addition, in a case where the evaluation value is the second definition, the connecting congestion index is a sum of the evaluation values set to be smaller in the order that board 4 exists in carry-in areas 17F and 17R, mounting areas 18F and 18R, and carry-out areas 19F and 19R, and the evaluation value is weighted so as to be smaller in component mounter M3 on the upstream side than that in component mounter M4 on the downstream side.

In FIG. 3, connecting transport lane determiner 67 determines into which of the plurality of connected transport lanes 8F and 8R board 4 is carried, based on connecting congestion index stored in connecting congestion index storage 65. Specifically, in a case where the evaluation value is set with the first definition, connecting transport lane determiner 67 determines to carry board 4 into connected transport lanes 8F and 8R in which the connecting congestion index becomes the smallest among the plurality of connected transport lanes 8F and 8R. In addition, in a case where the evaluation value is set with the second definition, connecting transport lane determiner 67 determines to carry board 4 into connected transport lanes 8F and 8R in which the connecting congestion index becomes the largest among the plurality of connected transport lanes 8F and 8R.

Connecting output processor 68 outputs the board movement signal for requesting to move transport conveyor 6 that holds board 4, to board sorting device M2 via management communicator 69 so as to be capable of directly carrying out board 4 to connected transport lanes 8F and 8R determined by connecting transport lane determiner 67. Further, connecting output processor 68 outputs the board request signal for requesting carry-in of board 4, to board sorting device M2 via management communicator 69 in a case where there is no board 4 in carry-in areas 17F and 17R on the most upstream side of connected transport lanes 8F and 8R determined by connecting transport lane determiner 67. In other words, connecting output processor 68 and management communicator 69 are connecting outputters for outputting the board request signal for requesting carry-in of board 4 into connected transport lanes 8F and 8R determined by connecting transport lane determiner 67, to board sorting device M2.

In the example illustrated in FIG. 6, connecting transport lane determiner 67 determines to carry board 4 into connected front side transport lane 8F having a small connecting congestion index, and connecting output processor 68 outputs the board movement signal and the board request signal to board sorting device M2 so as to carry board 4 into connected front side transport lane 8F. Board sorting device M2 sorts board 4 into connected transport lanes 8F and 8R determined by connecting transport lane determiner 67. According to this, it is possible to improve productivity by carrying board 4 into appropriate connected transport lanes 8F and 8R.

Next, a manufacturing method of a mounting board in component mounting line 1 will be described along the flow of FIG. 7. First, in component mounter M3 and the component mounter M4, congestion index calculator 50 calculates the congestion index for each of transport lanes 8F and 9R (ST1: congestion index calculating step). The calculated congestion index is transmitted to management computer 3. Next, in management computer 3, connecting congestion index calculator 66 adds up the congestion index of each of component mounters M3 and M4 and the weight stored in weight storage 64 by multiplication and calculates the connecting congestion index (ST2: connecting congestion index calculating step). In other words, for each of the plurality of connected transport lanes 8F and 8R, the connecting congestion index indicating the congestion degree is calculated by performing the weighting by component mounter M3 on the upstream side and component mounter M4 on the downstream side.

Figure 7:
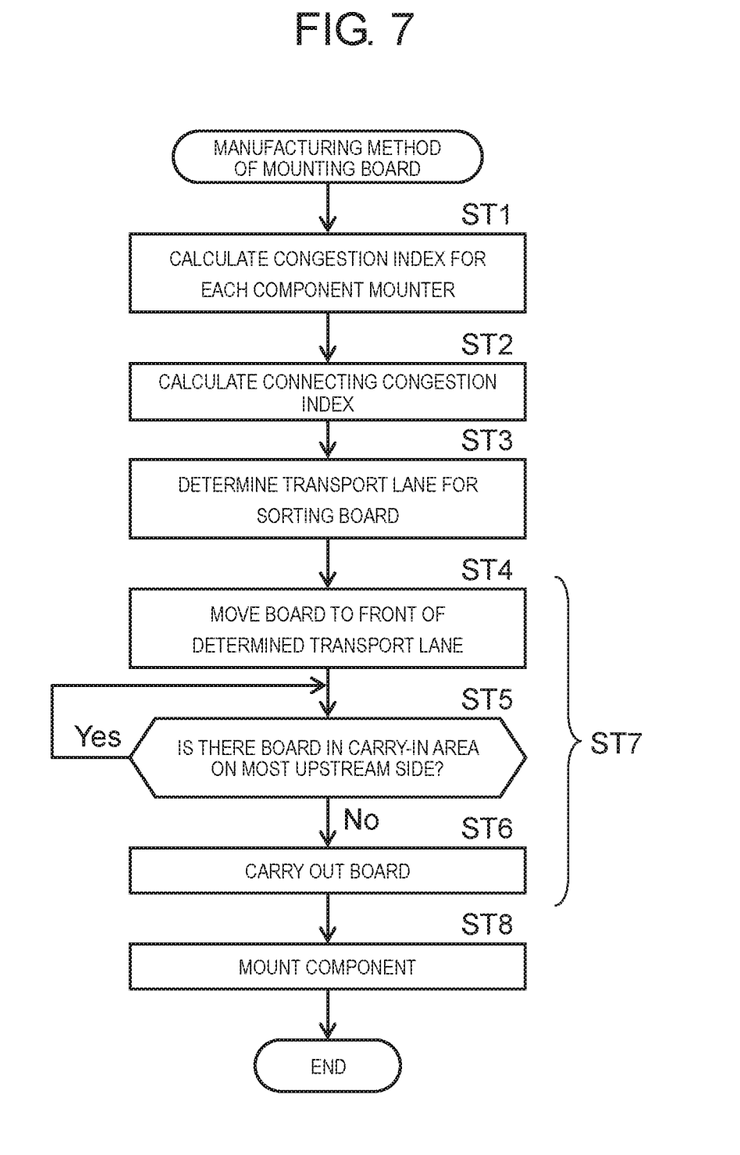
FIG. 7 is a flowchart illustrating a manufacturing method of a mounting board in the component mounting line according to the embodiment of the disclosure.

In FIG. 7, next, connecting transport lane determiner 67 determines into which of the plurality of connected transport lanes 8F and 8R board 4 is carried, based on the calculated connecting congestion index (ST3: connecting transport lane determining step). Next, connecting output processor 68 transmits (outputs) the information (board movement signal) of connected transport lanes 8F and 8R for carrying determined board 4 into board sorting device M2.

Board sorting device M2 which has received the board movement signal moves board 4 so as to be capable of carrying out board 4 to determined connected transport lanes 8F and 8R (ST4: board moving step). Next, when there is no board 4 in carry-in areas 17F and 17R on the most upstream side of determined connected transport lanes 8F and 8R (No in ST5), output processor 52 of component mounter M3 or connecting output processor 68 of management computer 3 transmits (outputs) the board request signal to board sorting device M2. The board sorting device which has received the board request signal carries out board 4 (ST6: board carrying-out step).

In this manner, a step from the board moving step (ST4) to the board carrying-out step (ST6) is a board sorting step (ST7) in which board sorting device M2 sorts board 4 into connected transport lanes 8F and 8R determined in connecting transport lane determining step (ST3). On board 4 carried into connected transport lanes 8F and 8R, the component transported to mounting areas 18F and 18R of the plurality of component mounters M3 and M4 is mounted (ST8: component mounting step).

As described above, component mounters M3 and M4 of the embodiment include: the plurality of transport lanes 8F and 8R for transporting board 4 sorted by board sorting device M2; congestion index calculator 50 for calculating the congestion index indicating the congestion degree of each of the plurality of transport lanes 8F and 8R; transport lane determiner 51 for determining into which of the plurality of transport lanes 8F and 8R board 4 is carried based on the calculated congestion index; and the outputter (output processor 52 and mounting communicator 53) for outputting the board request signal for requesting to carry board 4 into determined transport lanes 8F and 8R, to board sorting device M2. According to this, it is possible to improve productivity by carrying board 4 into appropriate transport lanes 8F and 8R.

Next, with reference to FIG. 8, component mounting line 101 of the other embodiment will be described. Component mounting line 101 of the other embodiment is different from component mounting line 1 of the above-described embodiment in the method of calculating the congestion index in management computer 102. Hereinafter, the same reference numerals will be given to the same configurations as those in the above-described embodiment, and the detailed description thereof will be omitted. Board sorting device M2 and component mounters M3 and M4 included in component mounting line 101 are the same as those included in component mounting line 1, and the description thereof will be omitted.

Figure 8:
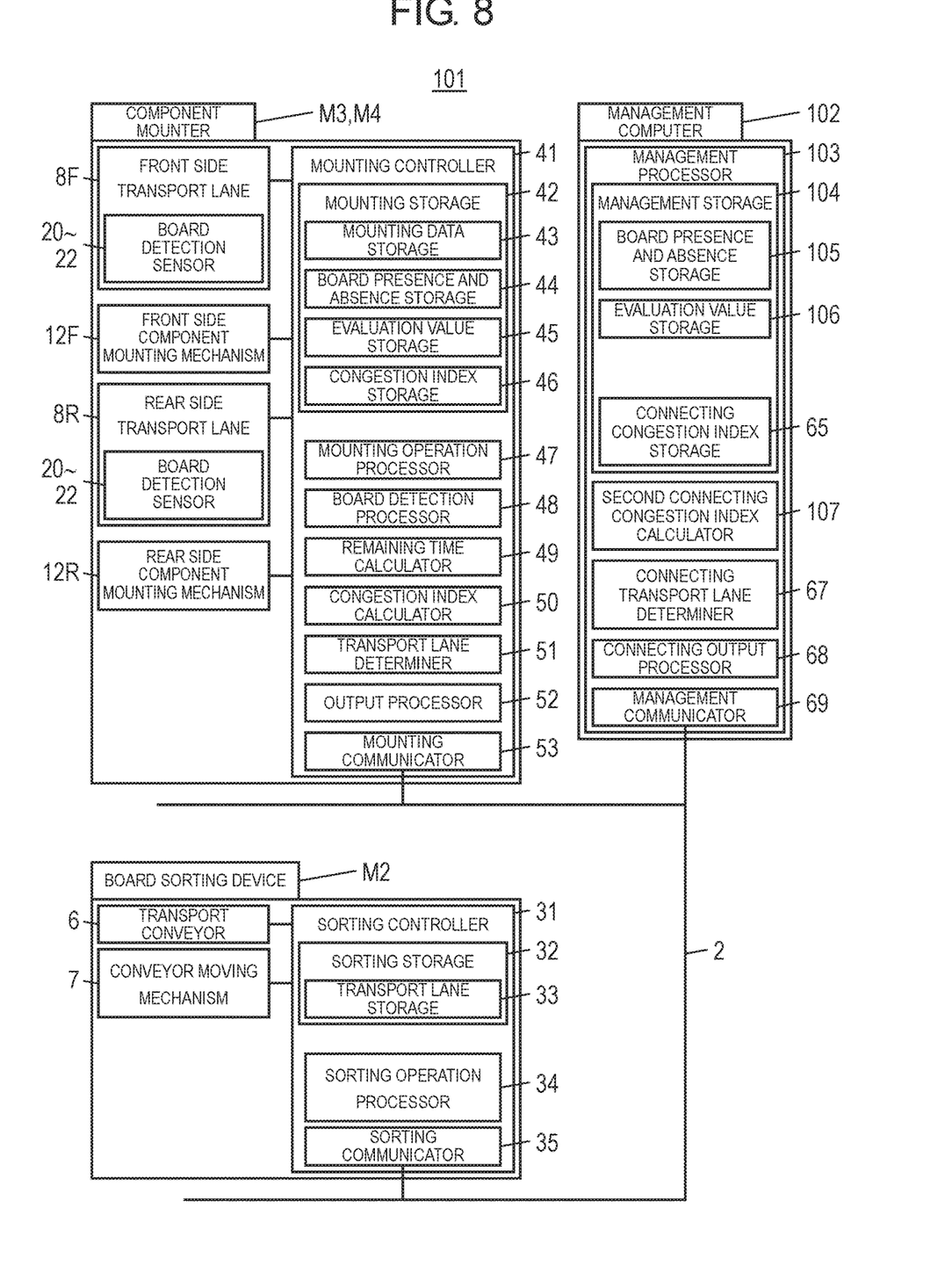
FIG. 8 is a block diagram illustrating a configuration of a control system of a component mounting line according to the other embodiment of the disclosure.

In FIG. 8, management computer 102 includes management processor 103. In addition to connecting transport lane determiner 67, connecting output processor 68, and management communicator 69, management processor 103 is provided with management storage 104 and second connecting congestion index calculator 107. Management storage 104 is a storage device, and in addition to connecting congestion index storage 65, board presence and absence storage 105 and evaluation value storage 106 are provided. In board presence and absence storage 105, presence and absence information of board 4 transmitted from component mounters M3 and M4 is stored in association with component mounters M3 and M4.

In evaluation value storage 106, evaluation values which are different in component mounter M3 on the upstream side and component mounter M4 on the downstream side, and which are the basis for calculating the connecting congestion index, are stored. In the example illustrated in FIG. 9, the evaluation values of carry-in areas 17F and 17R of component mounter M3 are set to be "6", the evaluation values of mounting areas 18F and 18R are set to be "5", and the evaluation values of carry-out areas 19F and 19R are set to be "4". The evaluation values of carry-in areas 17F and 17R of component mounter M4 are set to be "3", the evaluation values of mounting areas 18F and 18R are set to be "2", and the evaluation values of carry-out areas 19F and 19R are set to be "1".

Figure 9:
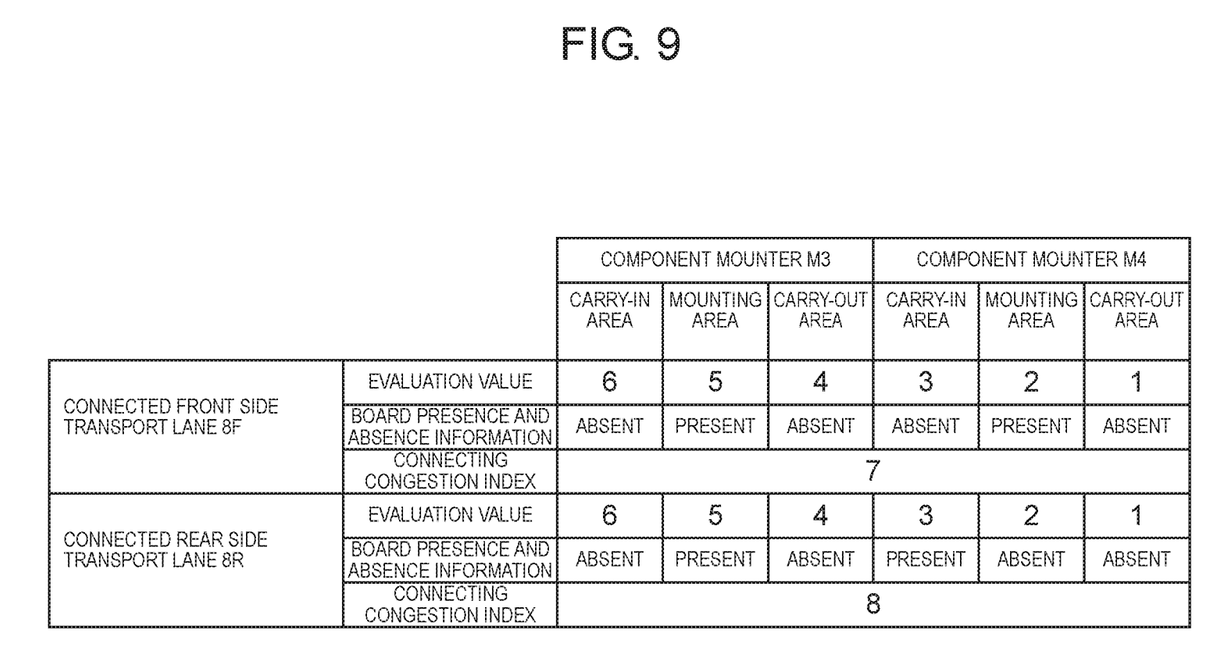
FIG. 9 is an explanatory view of calculation of a connecting congestion index in a component mounting line according to the other embodiment of the disclosure.

In other words, the evaluation values illustrated in FIG. 9 are set with the first definition in which the evaluation values are large in order of carry-in areas 17F and 17R, mounting areas 18F and 18R, and carry-out areas 19F and 19R. In addition, the evaluation value is weighted so as to be greater in component mounter M3 on the upstream side than that in component mounter M4 on the downstream side.

In FIG. 8, second connecting congestion index calculator 107 calculates the connecting congestion index based on the presence and absence information of board 4 in carry-in areas 17F and 17R, mounting areas 18F and 18R, and carry-out areas 19F and 19R in each of the plurality of component mounters M3 and M4 stored in board presence and absence storage 105 and the evaluation value stored in evaluation value storage 106.

Based on the remaining time during which the component is transmitted from component mounters M3 and M4, in a case where there is board 4 in mounting areas 18F and 18R, when the remaining time during which the component is mounted on board 4 is long, second connecting congestion index calculator 107 sets (recalculates) the evaluation value so as to be greater in a case of being set with the first definition, and to be smaller in a case of setting with the second definition.

Here, with reference to FIG. 9, the calculation by second connecting congestion index calculator 107 of the connecting congestion index of front side transport lane 8F and rear side transport lane 8R connected to each other between component mounter M3 and component mounter M4 will be described. The position of board 4 held in component mounting line 101 illustrated in FIG. 9 is the same as the example of component mounting line 1 illustrated in FIG. 6. Here, for the sake of simplicity, the ratio of the remaining time of the mounting work of board 4 being mounted in mounting areas 18F and 18R is 100%.

In FIG. 9, in connected front side transport lane 8F, there is board 4 in mounting area 18F of component mounter M3 and mounting area 18F of component mounter M4, and second connecting congestion index calculator 107 calculates the connecting congestion index as "7". In connected rear side transport lane 8R, there is board 4 in mounting area 18R of component mounter M3 and carry-in area 17R of component mounter M4, and second connecting congestion index calculator 107 calculates the connecting congestion index as "8". Connecting transport lane determiner 67 determines to carry board 4 into connected front side transport lane 8F having a small connecting congestion index.

Figure 10:
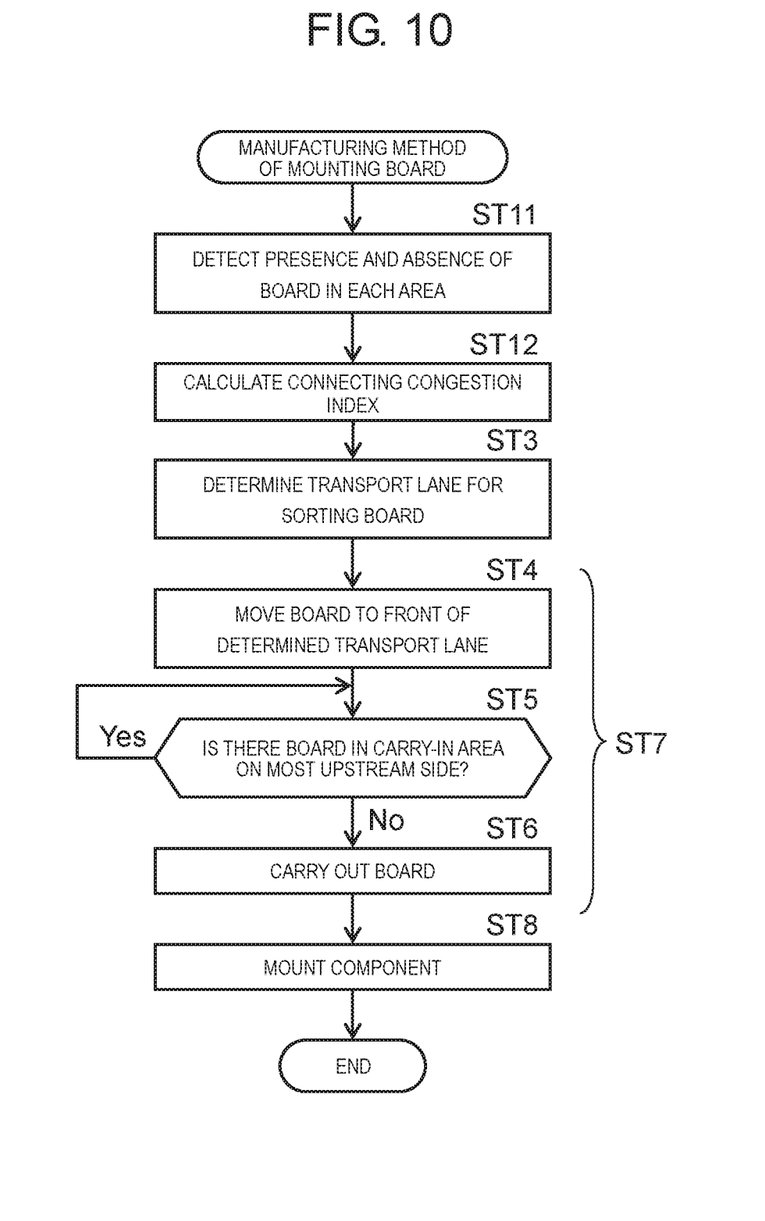
FIG. 10 is a flowchart illustrating a manufacturing method of a mounting board in a component mounting line according to the other embodiment of the disclosure.

Next, a manufacturing method of a mounting board in component mounting line 101 will be described along the flow of FIG. 10. First, in component mounter M3 and component mounter M4, board detection processor 48 detects the presence and absence of board 4 in each area (ST11: board presence and absence detecting step). The presence and absence information of detected board 4 is transmitted to management computer 102. Next, second connecting congestion index calculator 107 calculates the connecting congestion index based on the presence and absence information of board 4 of each of component mounters M3 and M4 and the evaluation value weighted so as to be greater in component mounter M3 on the upstream side than that in component mounter M4 on the downstream side. (ST12: second connecting congestion index calculating step).

In other words, in second connecting congestion index calculating step (ST12), the connecting congestion index is calculated based on the presence and absence information of board 4 in each of carry-in areas 17F and 17R, mounting areas 18F and 18R, and carry-out areas 19F and 19R of each of the plurality of component mounters M3 and M4. Next, the steps from connecting transport lane determining step (ST3) to component mounting step (ST8) to be executed are the same as the manufacturing method of the mounting board in component mounting line 1, and the description thereof will be omitted.

The component mounter, the component mounting line, and the manufacturing method of the mounting board of the disclosure have the effect that the productivity can be improved by carrying the board into an appropriate transport lane, and are useful in the field of mounting the component on the board.

What is claimed is:

1. A component mounter comprising:
a plurality of transport lanes for transporting a board sorted by a board sorting device; and
a controller comprising a processor and configured to:
calculate a congestion index indicating a congestion degree of each of the plurality of transport lanes,
determine a transport lane for carrying in the board among the plurality of transport lanes based on the calculated congestion index, and
output a board request signal for requesting to carry the board into the transport lane determined by the controller, to the board sorting device.

2. The component mounter of claim 1,
wherein each of the plurality of transport lanes includes a carry-in area for carrying in the board sorted by the board sorting device, a mounting area for mounting a component onto the board by receiving the board from the carry-in area, and a carry-out area for carrying out the board by receiving the board on which the component is mounted in the mounting area, and
wherein the controller calculates the congestion index for each of the plurality of transport lanes based on presence and absence information of other boards in the respective carry-in, mounting, and carry out areas.

3. The component mounter of claim 2,
wherein the controller calculates the congestion index for each of the plurality of transport lanes based on a first evaluation value of the respective carry-in area, a second evaluationvalue of the respective mounting area, a third evaluation value of the respective carry-out area, and the presence and absence information, and
wherein the second evaluation value is smaller than the first evaluation value and greater than the third evaluation value, or the second evaluation value is greater than the first evaluation value and smaller than the third evaluation value.

4. The component mounter of claim 2,
wherein the controller calculates the congestion index based on a remaining time during which the component is mounted on the board.

5. The component mounter of claim 2,
wherein the controller outputs the board request signal to the board sorting device when there is no board in the carry-in area of the transport lane determined by the controller.

6. A component mounting line comprising:
a plurality of component mounters each including a plurality of connecting transport lanes having a plurality of transport lanes for transporting a board;
a computer comprising a processor and configured to:
calculate a connecting congestion index indicating a congestion degree of each of the plurality of connecting transport lanes, and
determine a connecting transport lane for carrying in the board among the plurality of connecting transport lanes based on the calculated connecting congestion index; and
a board sorting device for sorting the board into the connecting transport lane determined by the computer.

7. The component mounting line of claim 6, wherein each of the plurality of transport lanes includes a carry-in area for carrying in the board from an upstream side, a mounting area for mounting a component onto the board by receiving the board from the carry-in area, and a carry-out area for carrying out the board to a downstream side by receiving the board on which the component is mounted in the mounting area, and wherein the computer calculates the connecting congestion index for each of the plurality of transport lanes based on presence and absence information of other boards in the respective carry-in, mounting, and carry out areas.

8. The component mounting line of claim 7, wherein the computer calculates the connecting congestion index for each of the plurality of transport lanes based on a first evaluation value of the respective carry-in area, a second evaluation value of the respective mounting area, a third evaluation value of the respective carry-out area, and the presence and absence information, and wherein the second evaluation value is smaller than the first evaluation value and greater than the third evaluation value, or the second evaluation value is greater than the first evaluation value and smaller than the third evaluation value.

9. The component mounting line of claim 8, wherein the plurality of component mounters include a component mounter on an upstream side and a component mounter on a downstream side, wherein the computer calculates the connecting congestion index based on the corresponding first, second, and third evaluation values associated with the respective transport lane, a first weight of the component mounter on the upstream side, and a second weight of the component mounter on the downstream side, and the presence and absence information, wherein the second weight is smaller than the first weight when the second evaluation value is smaller than the first evaluation value, and wherein the second weight is greater than the first weight when the second evaluation value is greater than the first evaluation value.

10. The component mounting line of claim 7, wherein the computer calculates the connecting congestion index based on a remaining time during which the component is mounted on the board.

11. The component mounting line of claim 7, wherein the board sorting device sorts the board into the connecting transport lane when there is no board in the carry-in area on the most upstream side of the connecting transport lane determined by the computer.

12. The component mounting line of claim 7, wherein the board sorting device moves the board such that the board can be carried out to the connecting transport lane determined by the computer, and the board is carried out when there is no board in the carry-in area on the most upstream side of the connecting transport lane.

13. A manufacturing method of a mounting board in the component mounting according to claim 6, the method comprising:

a connecting congestion index calculating step of calculating a connecting congestion index indicating a congestion degree of each of the plurality of connecting transport lanes;

a connecting transport lane determining step of determining a connecting transport lane for carrying in the board among the plurality of connecting transport lanes based on the calculated connecting congestion index; and a board sorting step of sorting the board by the board sorting device into the connecting transport lane determined in the connecting transport lane determining step.

14. The manufacturing method of a mounting board of claim 13, wherein each of the plurality of transport lanes includes a carry-in area for carrying in the board from an upstream side, a mounting area for manufacturing the mounting board by mounting a component onto the board by receiving the board from the carry-in area, and a carry-out area for carrying out the board to a downstream side by receiving the board on which the component is mounted in the mounting area, and wherein, in the connecting congestion index calculating step, the connecting congestion index is calculated for each of the plurality of transport lanes based on presence and absence information of the board in the respective carry-in, mounting, and carry out areas.

15. The manufacturing method of a mounting board of claim 14, wherein the connecting congestion index is calculated based on a first evaluation value of the respective carry-in area, a second evaluation value of the respective mounting area, a third evaluation value of the respective carry-out area, and the presence and absence information, and wherein the second evaluation value is smaller than the first evaluation value and greater than the third evaluation value, or the second evaluation value is greater than the first evaluation value and smaller than the third evaluation value.

16. The manufacturing method of a mounting board of claim 14, wherein the plurality of component mounters include a component mounter on an upstream side and a component mounter on an downstream side, wherein the connecting congestion index is calculated based on the corresponding first, second, and third evaluation values , a first weight of the component mounter on the upstream side, and a second weight of the component mounter on the downstream side, and the presence and absence information, wherein the second weight is smaller than the first weight when the second evaluation value is smaller than the first evaluation value, and wherein the second weight is greater than the first weight when the second evaluation value is greater than the first evaluation value.

17. The manufacturing method of a mounting board of claim 14, wherein the connecting congestion index is calculated based on a remaining time during which the component is mounted on the board.

18. The manufacturing method of a mounting board of claim 14, wherein, in the board sorting step, the board sorting device sorts the board into the connecting transport lane when there is no board in the carry-in area on the most upstream side of the connecting transport lane determined in the connecting transport lane determining step.

19. The manufacturing method of a mounting board of claim 1 wherein the board sorting step further includes a board moving step of moving the board by the board sorting device such that the board can be carried out to the connecting transport lane determined in the connecting transport lane determining step, and a board carrying-out step of carrying out the board by the board sorting device when there is no board in the carry-in area on the most upstream side of the connecting transport lane.

\* \* \* \* \*